(12) United States Patent
Khouri et al.

(10) Patent No.: US 6,259,635 B1
(45) Date of Patent: Jul. 10, 2001

(54) CAPACITIVE BOOSTING CIRCUIT FOR THE REGULATION OF THE WORD LINE READING VOLTAGE IN NON-VOLATILE MEMORIES

(75) Inventors: Osama Khouri, Milan; Rino Micheloni, Turate; Ilaria Motta, Cassolnovo; Andrea Sacco, Alessandria; Guido Torelli, Sant'Alessio Con Vialone, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/491,476

(22) Filed: Jan. 19, 2000

(30) Foreign Application Priority Data

Jan. 19, 1999 (IT) ................................................ MI99A0081

(51) Int. Cl.[7] .................................................... G11C 16/04
(52) U.S. Cl. ................................ 365/189.09; 365/185.18
(58) Field of Search ............................ 365/185.18, 185.2, 365/185.23, 185.33, 226

(56) References Cited

U.S. PATENT DOCUMENTS

| | | | | |
|---|---|---|---|---|
| 5,453,953 | * | 9/1995 | Dhong et al. | 365/226 |
| 5,657,271 | * | 8/1997 | Mori | 365/185.18 |
| 5,726,944 | * | 3/1998 | Pelley, III et al. | 365/226 |
| 5,793,679 | * | 8/1998 | Caser et al. | 365/226 |
| 5,909,396 | * | 6/1999 | Le et al. | 365/185.23 |
| 6,002,630 | * | 12/1999 | Chuang et al. | 365/226 |

\* cited by examiner

*Primary Examiner*—Trong Phan
(74) *Attorney, Agent, or Firm*—Theodore E. Galanthay; E. Russell Tarleton; Seed IP Law Group PLLC

(57) ABSTRACT

A circuit for the regulation of the word line voltage in a memory, comprising a voltage regulator suitable to generate an output regulated voltage to be supplied to one or more word lines of the memory when the one or more word lines are being selected. The circuit includes a voltage boosting circuit that is coupled to the output of said voltage regulator and that can be activated upon the selection of one or more memory word lines in order to boost the regulated voltage upon the selection of the one or more memory word lines.

19 Claims, 5 Drawing Sheets

CAPACITIVE BOOSTING CIRCUIT FOR THE REGULATION OF THE WORD LINE READING VOLTAGE IN NON-VOLATILE MEMORIES

TECHNICAL FIELD

The present invention refers to the field of semiconductor memories, particularly of non-volatile type memories. More specifically, the invention concerns a circuit for the regulation of the word line voltage during the step of reading of a non-volatile memory, particularly but not exclusively a multilevel non-volatile memory (that is a memory whose cells are programmable to one of more levels of threshold voltage, and that are therefore capable to store more than one bit per single cell), for instance a multilevel non-volatile memory integrated in a device with a single supply voltage.

BACKGROUND OF THE INVENTION

As known, for the reading of multilevel non-volatile memories it is necessary to provide the addressed word line of the matrix of memory cells with a stable and accurate voltage, with the aim of guaranteeing optimal conditions for the reading operation. In multilevel memories the difference between the values of memory cell threshold voltage corresponding to the different logical states that are memorizable in the same cell is reduced with respect to the case of traditional cells of a non-volatile memory with two programming levels that can memorize one bit only.

It results that the reading voltage for the word lines addressed in turn must be supplied through a voltage regulator, as shown in FIG. 1, where there is a voltage regulator 1 supplied with a voltage $V_{sup}$ that is generally different from the memory supply voltage $V_{DD}$. A row decoding circuit 2 decodes word line addresses Ai whose logic levels "0" and "1" correspond to the ground voltage and to the memory supply voltage $V_{DD}$. A voltage elevator (high switch) circuit 3 increases the value of voltage corresponding to the logical state "1" from $V_{DD}$ to a higher value $V_R$. A final driving stage 4 for a respective word line (word line driver) is supplied with the voltage $V_{reg}$ provided by the regulator 1. $C_R$ represents the global capacitive load connected with the output of the regulator 1 when no word line is selected.

In multilevel memories the voltage $V_{sup}$ is typically higher than the memory supply voltage $V_{DD}$, which in the devices of the current generation has a nominal value of 3 V. The more commonly adopted technique for the generation of voltages higher than $V_{DD}$ inside a MOS technology integrated circuit is the utilization of voltage multiplication circuits with a charge pump. Circuits of this type are capable of providing the required values of voltage, but they generally have limited ability to deliver output current; and when they are started (for instance when the integrated circuit is turned on or when returning from a condition of disabling ("power down") or of quiescence ("stand-by"), in which the circuit is turned off with the purpose of obtaining a saving in power consumption) they require of a certain time in order to bring the output voltage from the initial zero value to the desired value, and this time is greater the higher the capacitance value of the same circuit output charge.

The elevator circuit 3 can be for instance made up of a pull-up P-channel MOS transistor connected between the inlet of the word line driver 4 and the supply line $V_{reg}$ of the same driver 4 and with the gate electrode grounded. Other known techniques can be used for this purpose.

The enabling of a specific word line of memory cells takes place when the address of the location of memory to be read changes, in the example herein shown the word line address signals Ai, or in any case when an opportune signal is provided that indicates that one (or more) determined word line must be selected and activated. The decoder 2 generates output logic signals that are suitable to select the desired word line through the final stages 4. Each final stage 4 is essentially made up of a CMOS inverter.

FIG. 2 schematically illustrates a circuit that can typically be utilized for the voltage regulator 1 of FIG. 1. The voltage regulator is substantially made up of a loop comprising an operational amplifier A connected in negative feedback through two resistors R1, R2, which provides an output voltage $V_{reg}$ with nominal value equal to $V_R$. The operational amplifier A receives a fixed reference voltage $V_{BG}$ on the non-inverting terminal. If the gain of the operational amplifier is sufficiently high, ignoring non-idealities as the offset voltages, the output voltage of the regulator 1 is equal to:

$V_{reg}=V_{BG} \times (1+R1/R2)$

In an integrated circuit the ratio between the resistances of the two resistors R1 and R2 can be realized with a very high degree of precision, still neglecting non-ideal effects, so that the accuracy of the value of the generated voltage $V_{reg}$ substantially depends on the accuracy of the value of the reference voltage $V_{BG}$. The latter can be obtained in a known way by means of a generator of "band-gap" reference voltage that generates a very accurate voltage and that is provided with good stability even with variable parameters such as supply voltage and temperature.

The single word line is perceived by the regulator 1 as a capacitive load $C_W$ (more precisely, the word line is a distributed RC load), since the word line does not determine an absorption of direct current, but it has non-negligible stray capacitance, substantially connected between said word line and ground, or between the word line and other nodes (for descriptive simplicity the global stray capacitance $C_W$ can however be considered to be connected between the word line and the ground).

When a determined word line of the memory matrix (array) is not being addressed, it is grounded, and therefore the capacitance $C_W$ associated with it is discharged.

When the word line is addressed, its voltage must be brought by the respective driver 4 to the value required for the correct execution of the reading operation, a value that will be indicated by $V_R$. More precisely, for a correct execution of the reading operation the voltage of the word line must be comprised within a determined interval around the value $V_R$. When the word line is selected, it is connected with the output of the voltage regulator 1 by the driver 4. The voltage $V_{reg}$ supplied by the regulator, that in static conditions is ideally equal to $V_R$, undergoes a decrement. The decrement is due to a phenomenon of "charge sharing" between the total load capacitance $C_R$ connected with the output of the regulator when no word line is selected, and the capacitance $C_W$ of the word line. Whenever for reasons of memory architecture more word lines are selected simultaneously, then the load that is connected to the output of the voltage regulator (and that will give rise to the phenomenon of charge sharing) will consist of the total capacitive load of all the word lines that have simultaneously been selected. Hereinafter, the symbol $C_W$ will refer to the total load that is connected with the output of the regulator.

The decrement in the output voltage of the voltage regulator is very quick, as the phenomenon of charge sharing is very fast, and it can be excessive in the sense that the value of the voltage $V_{reg}$ goes out of the interval required for the correct execution of the reading operation. The recovery of the voltage $V_{reg}$, that is the recovery of the output voltage of the regulator within the interval that allows execution of an optimal reading, must be sufficiently fast, so that the time of access of the memory is not degraded and, above all, no erroneous reading occur.

Purely as an example, considering the case of EEPROM Flash memories in sub-micrometric technology that are organized in memory sectors with appropriate size, the values involved are reasonably the following:

$V_R$=6 V;

$C_R$=100 pF;

$C_W$=3 pF;

$\Delta V_{max}$=50 mV, where $\Delta V_{max}$ indicates the maximum error allowed for the voltage $V_{reg}$ during the reading step; in other words, the recovery of the voltage $V_{reg}$ after the selection of the new word line (or word lines) is considered to be obtained when the voltage $V_{reg}$ is brought back to a value within 50 mV of the value in regime conditions of $V_{reg}$, that is $V_R$, and it remains within 50 mV around this value afterwards.

The stray capacitance $C_R$ connected with the output of the voltage regulator (100 pF in the example reported herein) is very remarkable. Such capacitance is due to the components that are physically necessary in order to realize the word line decoding. In fact, the voltage regulator supplies the final stages of the word line decoding circuit. Therefore, it is not possible to reduce such stray capacitance in a substantial way. The presence of a high stray capacitive load slows down the operation of the voltage regulator. In particular, there will be a considerable slowness in the recovery of the output voltage $V_{reg}$ in the above-mentioned case of decrement in the $V_{reg}$ due to charge sharing following the selection of a word line that was previously grounded.

Considering the sample values reported above, it is possible to calculate the requirement in terms of current from the voltage regulator upon the selection of a word line. The charge required by the capacitance $C_W$ in coincidence with the selection of the word line is equal to:

$$(V_R - \Delta V_{max}) \times C_W = 14.28 \, pC.$$

If we take as an objective a recovery time of 20 ns, the current that the regulator must deliver in the case of maximum efficiency (no loss), and assuming a delivery with current constant through time, is equal to 715 μA. The real current requirement might in practice be higher because of non-ideal effects that decrease the general efficiency of the circuit.

When the reading of a determined word line is enabled, this must be charged at the voltage $V_R$. The charge initially stored in the capacitance $C_R$ is shared by charge sharing with the stray capacitance $C_W$ of the selected word line. As a consequence of the phenomenon of charge sharing, the voltage at the output of the regulator 1 is:

$$V_{reg}' = C_W \times V_R / (C_W + C_R).$$

Therefore a voltage drop will be determined at the output of the voltage regulator 1 that will ideally be equal to:

$$\Delta V_R = V_R - V_{reg}' = V_R / (1 + C_R / C_W) \cong V_R \times C_W / C_R.$$

With the exemplification values herein provided, the result will be $\Delta V_R \cong 200$ mV, that is higher than the maximum allowed value $\Delta V_{max}$ of 50 mV. Therefore, in the presence of high total capacitive loads at the output of the regulator 1, the recovery of the Voltage $V_{reg}$ can be excessively slow, since the gain-bandwidth product of the amplification structure is obviously limited.

SUMMARY OF THE INVENTION

The present invention provides a circuit for the regulation of the word line reading voltage that guarantees a fast recovery of the regulated voltage $V_{reg}$ when one (or more) new word line is selected.

An embodiment of the present invention is directed to a circuit for the regulation of the word line voltage in a memory, comprising a voltage regulator suitable to generate an output regulated voltage to be supplied to one or more word lines of the memory when said one or more word lines are being selected. The circuit includes boosting means that are coupleable to the output of said voltage regulator and that can be activated upon the selection of said one or more memory word lines in order to boost said regulated voltage upon the selection of said one or more memory word lines.

BRIEF DESCRIPTION OF THE DRAWINGS

The characteristics and the advantages of the present invention will be made more evident by the following detailed description of two embodiments thereof that are illustrated as non limiting examples in the enclosed drawings, in which.

DETAILED DESCRIPTION OF THE INVENTION

Figure 1:
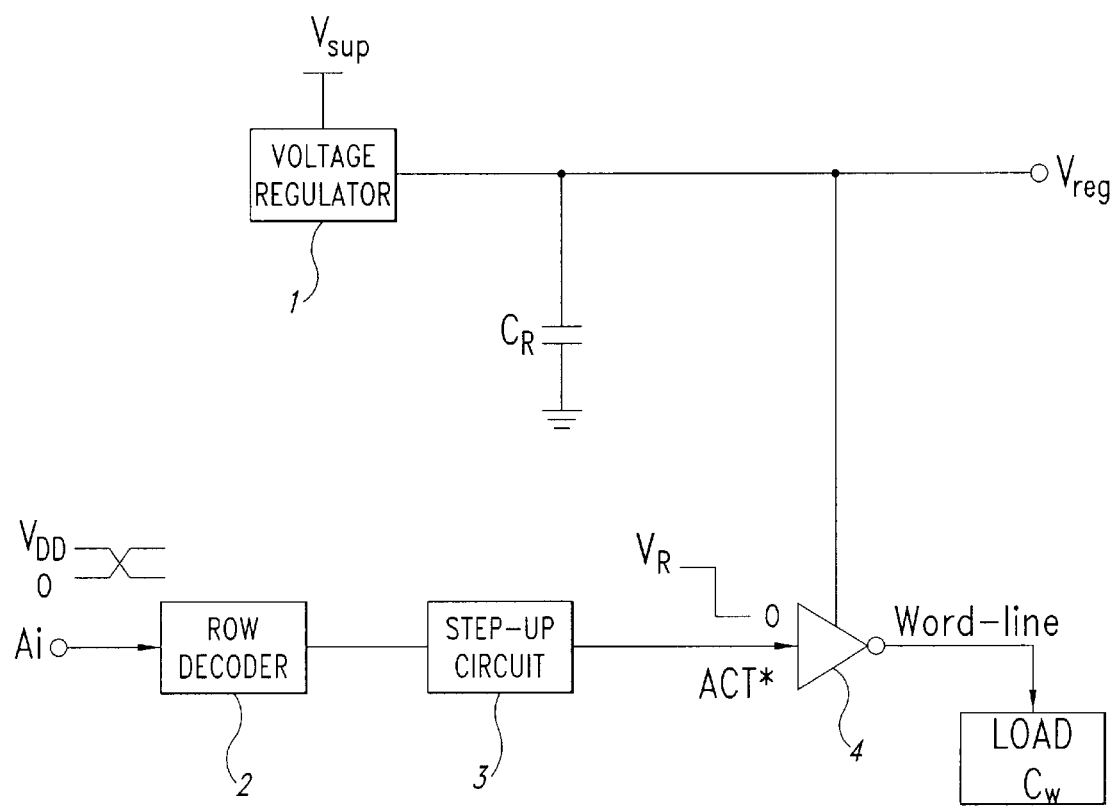
FIG. 1 schematically shows a circuit for the selection of word lines with a word line voltage regulator according to the known technique.
Figure 2:
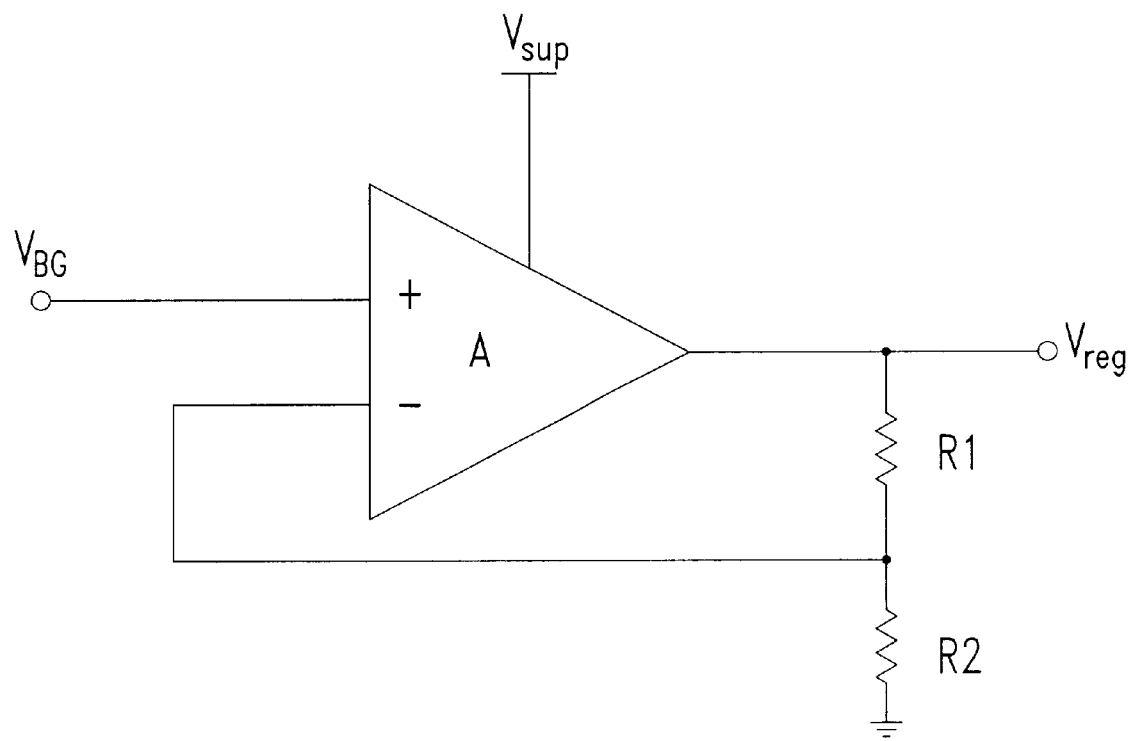
FIG. 2 schematically shows the voltage regulator circuit of FIG. 1.
Figure 3:
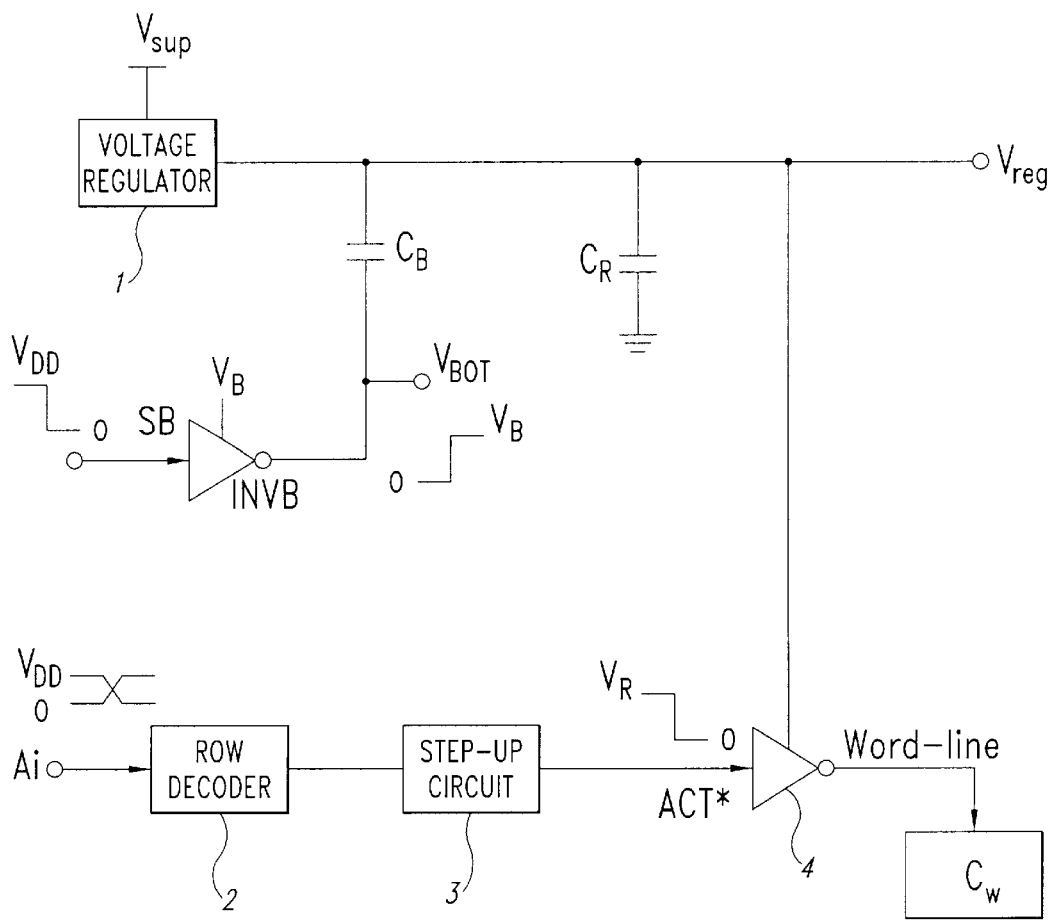
FIG. 3 schematically shows a circuit according to a first embodiment of the present invention.

With reference to FIG. 3, there is shown a circuit according to a first embodiment of the present invention. In the figure, the same elements that are already present in the known circuit of FIG. 1 are referred to by the same reference numbers. In addition to the known circuit, the circuit of FIG. 3 comprises a capacitor $C_B$ connected between the output $V_{reg}$ of the regulator 1 and a node $V_{BOT}$. The node $V_{BOT}$ is in turn connected with the output of an inverter INVB that is supplied with a voltage $V_B$. The inverter INVB is driven by a digital signal SB, normally with a logic level "1" (the latter has a voltage equal to $V_{DD}$ if $V_B$ is equal or lower than $V_{DD}$, as it is preferable for a more efficient embodiment of the present solution, as shown hereinafter; if $V_B$ is higher than $V_{DD}$, the logic value "1" will have a voltage equal to $V_B$) and that is brought to a logic level "0" (ground) when a new word line is selected, in order to determine a capacitive boosting effect.

The circuit is sized in order to meet the following equation:

$$C_B \times V_B = C_W \times V_R.$$

When operating, before a new word line is selected, the capacitor $C_B$, is precharged to the voltage $V_R$ by the voltage regulator; the lower plate of the capacitor $C_B$, that is the node $V_{BOT}$, is in fact maintained grounded, since signal SB has a logic level "1".

When, as a consequence of the addressing of the memory, a new word line must be selected, and therefore it is necessary to connect the selected word line (or word lines) with the relative capacitance $C_W$ associated with it to the line $V_{reg}$, the signal SB is brought to the logic level "0", so that the output of the inverter INVB brings the lower plate of the capacitor $C_B$ to voltage $V_B$ which supplies the inverter INVB.

Once the transient is over, assuming that the voltage regulator 1 does not intervene (as it can occur, at least ideally, as shown hereinafter), on the line $V_{reg}$ there will be the following charge balance:

$$Q_{IN}=C_B \times V_R + C_R \times V_R = Q_{IN} = C_B \times (V_{FIN} - V_B) + C_R \times V_{FIN} + C_W \times V_{FIN}$$

from which, since $C_W \times V_B = C_W \times V_R$, we have:

$$(C_B+C_R+C_W) \times V_R = (C_B+C_R+C_W) \times V_{FIN}$$

that is $V_{FIN}=V_R$

In the previous relationships, $V_{FIN}$ is the value of the voltage $V_{reg}$ at the end of the transient, and $Q_{IN}$ and $Q_{FIN}$ are the values of the charge in the capacitance system ($C_B$, $C_W$, $C_R$) respectively at the beginning and at the end of the transient.

Substantially, the voltage on the line $V_{reg}$ remains the same before and after the selection of the word line: the charge $C_B \times V_b$ is transferred from the capacitor $C_B$ to the capacitance $C_W$ of the selected word line, and said charge transfer does not involve, at least ideally, the capacitance $C_R$ that is as a result charged with the same voltage $V_R$ at the beginning and at the end of the operation. This allows a very rapid settlement of the voltage on the selected word line, ideally without the need of an action by the voltage regulator 1.

The quantity of charge $C_B \times V_B$ must ideally be equal to $C_W \times V_R$. In order to guarantee that the voltage $V_B$ is accurate, it can be generated in a known way by means of a circuit of regulation utilizing a "band-gap" type reference voltage.

The voltage $V_B$ can be lower than the supply voltage $V_{DD}$, and therefore can for instance be generated by means of a voltage regulator starting from the supply voltage $V_{DD}$ without having to request any current to the voltage generator $V_{sup}$. That is particularly advantageous when the voltage $V_{sup}$ is obtained by means of a voltage multiplier based on the charge pump approach.

The capacitance value of the boosting capacitor $V_B$ will be higher as the lower is the value of the voltage $V_B$. It is therefore necessary to make a compromise between the values $V_B$ and $C_B$, so as to meet the relationship $C_B \times V_B = C_W \times V_R$.

Figure 4:
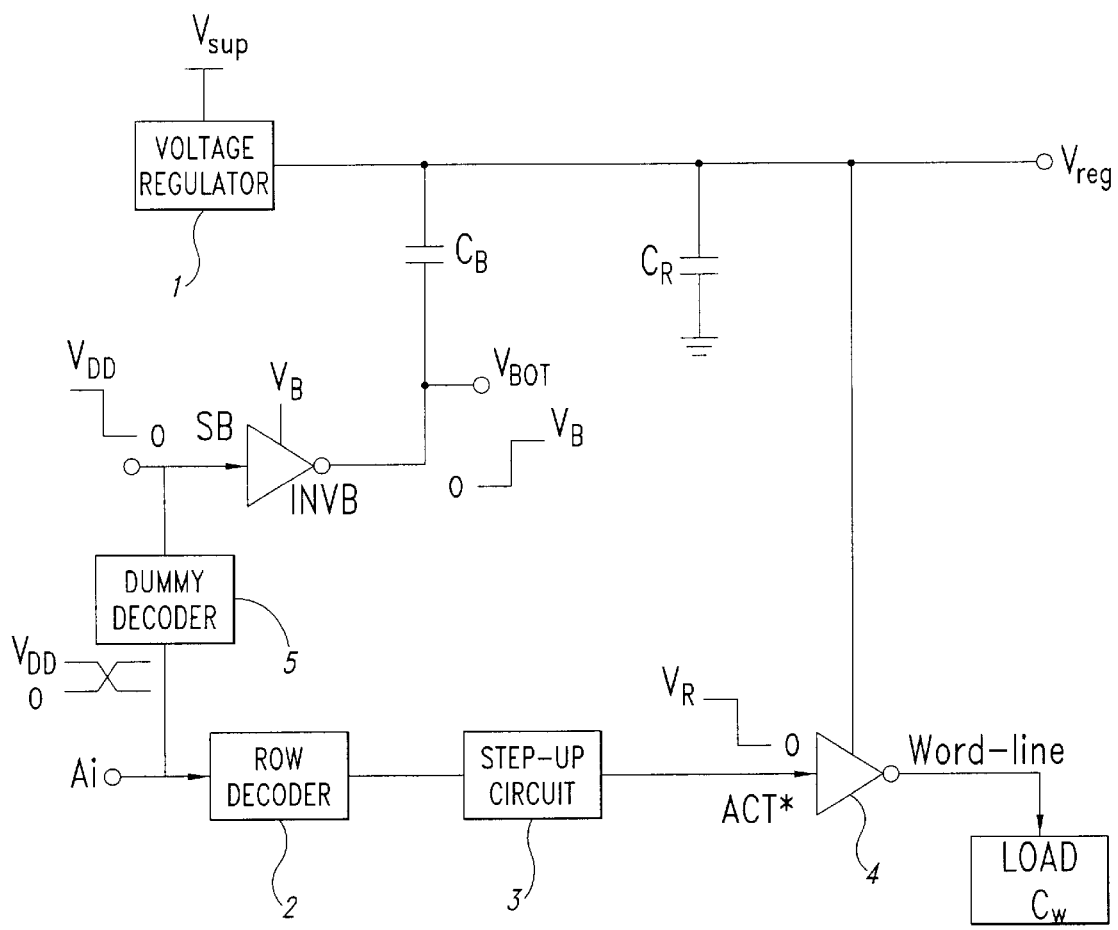
FIG. 4 schematically shows the circuit of FIG. 3, complete with control elements.

The driving signal $S_B$ of the inverter INVB can for instance be obtained by means of a chain in which the path of the same signal $S_B$ is in an appropriate relationship with the signals that, starting from the word line address signals Ai, generate the signals ACT* that drive the drivers of the word lines 4. This, with the purpose of guaranteeing an adequate time relationship between the switching edge "1"→"0" of the signal $S_B$, that determines the effect of capacitive boosting, and switching edge "1"→"0" of the signal ACT* that determines the connection of the new selected word line to the line $V_{reg}$. FIG. 4 shows a circuit scheme of principle suitable to achieve the aforesaid time relationship. In such figure, the elements identical to those of FIG. 3 are referred to by means of the same reference numbers. In order to obtain the desired time relationship between the signal $S_B$ and the signal ACT*, the signal $S_B$ is generated starting from the same word line address signals Ai, through a "fictitious" ("dummy") decoding circuit 5 that is substantially identical to the real decoding circuit 2.

After the reading of the addressed memory cells has correctly been carried out, thus after the datum memorized in them has been read, the signal $S_B$ gets back to the logic level "1" and the lower plate of the capacitor $C_B$ is grounded again, so as to allow the capacitor $C_B$ to be recharged to the voltage $V_R$. For such purpose it will be possible to advantageously use an "end of reading" signal that could already be present for other purposes in the memory, and that will condition the return of the signal $S_B$ to the logic level "1".

If the new access to the memory, that is the new request of reading, involves a memory word belonging to the same word line that is already currently addressed, if the word line is already selected and therefore the relative capacitance $C_W$ is already charged to the voltage $V_R$, it will not be necessary to activate the capacitance boosting circuitry; in this way it will be possible to prevent modifying the voltage present on the line $V_{reg}$. For this purpose it will be sufficient to inhibit the switching "1"→"0" of the signal $S_B$ that drives the inverter INYB.

The charge requested to the voltage regulator 1 upon the selection of a new word line is ideally zero, since the charge necessary to bring the word line, and therefore to charge the capacitance $C_W$, to the voltage $V_R$ is supplied by the capacitor $C_B$. In practice, there will obviously be a loss in efficiency, due for instance to the intervention of the voltage regulator 1 and to the presence of stray capacities. When it is necessary to recharge the capacitor $C_B$ to the voltage $V_R$, the necessary charge is however requested to the voltage regulator 1. The node $V_{BOT}$ is in fact brought back to ground and the voltage on the line $V_{reg}$ undergoes a decrement that must be recovered before a new reading of the memory can be performed. The time available for the charging of the capacitor $C_B$ is however higher than the time necessary for the settling of the voltage on the word line upon the selection of the same. For the recharging of the capacitor $C_B$ it is in fact possible to devote, at least ideally, all the time between the instant in which the operation of reading of the memory cells currently addressed is over and the instant in which, after the start of a new reading of the memory, it is necessary to carry out the capacitive boosting through the capacitor $C_B$. The structure therefore demonstrates to be advantageous.

Figure 5:
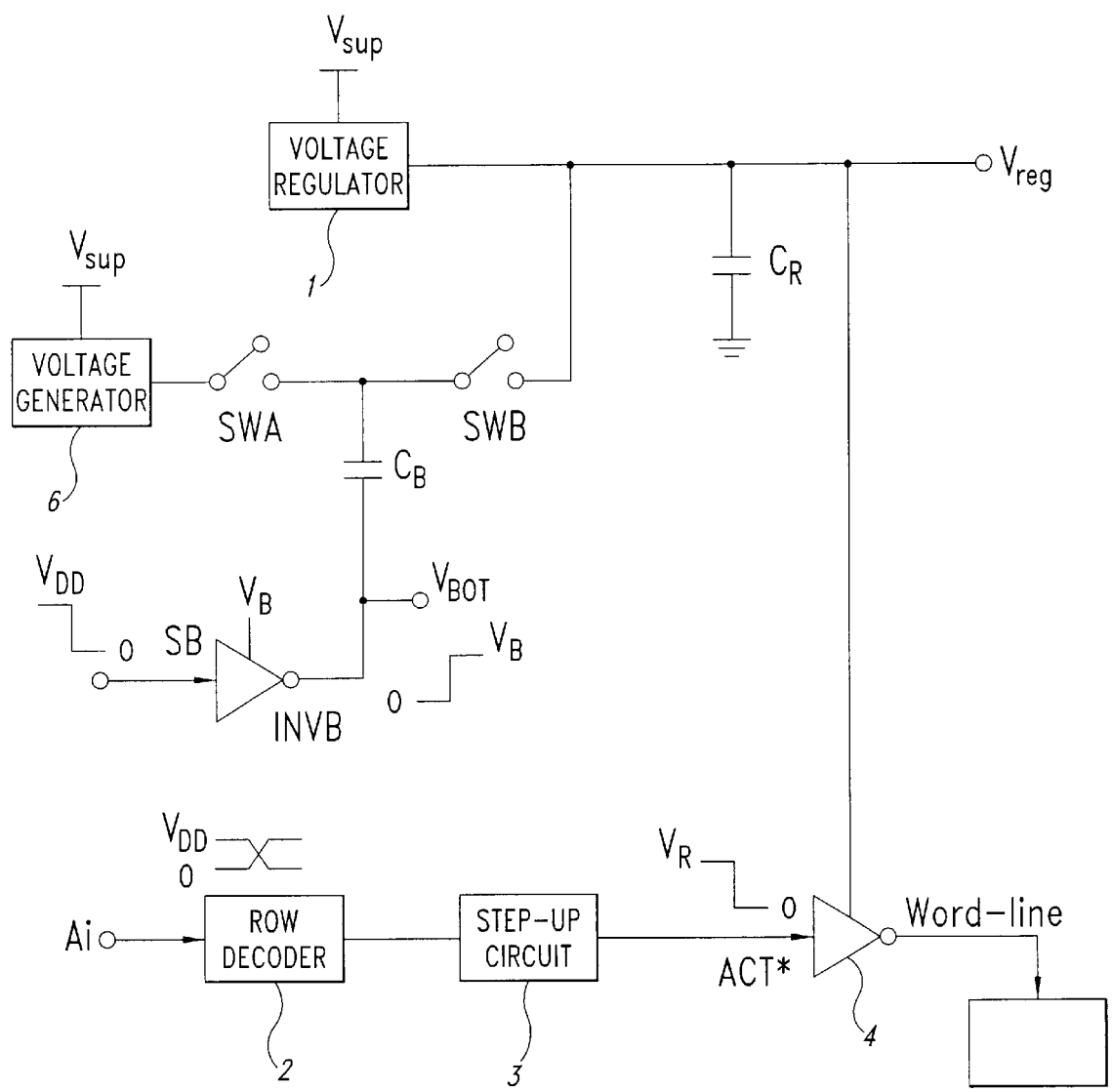
FIG. 5 schematically shows a circuit according to a second embodiment of the present invention.

FIG. 5 schematically shows a second embodiment of the present invention. In this figure too, the elements common to the structures of the previous figures are referred to by same reference numbers. The circuit of FIG. 5 does not show the drawback connected with the charging of the capacitor $C_B$ by the voltage regulator 1 and with the consequent possibility of modifying the voltage $V_{reg}$ during this step of charging. In the circuit of FIG. 5 an additional voltage regulator 6 is used for the charging of the capacitor $C_B$ that is distinct from the main voltage regulator 1 and that is supplied for instance with the same voltage $V_{sup}$. The voltage regulator 6 provides an output voltage $V_{RA}$ that is nominally equal to the voltage $V_R$ supplied by the main regulator 1.

When the capacitor $C_B$ must be charged to the voltage $V_{RA}=V_R$, its upper plate is connected with the output of the voltage regulator 6 through a switch SWA, that gets therefore closed; in this step, a second switch SWB is kept open, and the signal $S_B$ is maintained at the logic level "1." When there is a request of reading of the memory, the switch SWA gets opened and the upper plate of the capacitor $C_B$ gets connected with the line $V_{reg}$ through the switch SWB, that is thus closed. The signal $S_B$ is therefore brought to the logic level "0", thus determining the desired effect of capacitive boosting. Once the charge transfer toward the line $V_{reg}$ has been completed, the upper plate of the capacitor $C_B$ gets disconnected from the line $V_{reg}$ thus opening the switch SWB again, and it gets connected to the output of the voltage regulator 6 through the switch SWA, while the signal $S_B$ is brought again to the logic level "1" in order to allow the recharging of the capacitor $C_B$ at the voltage $V_{RA}=V_R$.

It is opportune that the switching "0"→"1" of the node $V_{BOT}$ takes place when the upper plate of the capacitor $C_B$ is already connected with the line $V_{reg}$. In this way indeed the voltage on the upper plate of the capacitor $C_B$ does not undergo any excessive transient increases in voltage. That is useful in order to assure the inhibition of the switch SWA when this is realized for instance by means of a P channel MOS transistor, whose driving signal has ground and voltage $V_R$ as logic levels. The circuitry that generates the driving signals of the switches SWA and SWB could therefore be supplied directly by the voltage regulator 6, with no need to resort to voltage elevator structures that would complicate the circuit.

The voltage regulator 6 is faster than the voltage regulator 1, since the capacitive load of the first one only consists in the capacitor $C_B$. In addition the charging operation of the capacitor $C_B$ does not affect the voltage on the line $V_{reg}$ and therefore it does not modify the voltage on the selected word line.

A variation of the circuit of FIG. 5 consists in using not one, but two or more boosting capacitors equal to each other and separately driven. When the selection of a new word line takes place, the effect of capacitance boosting previously described is obtained for instance through a first boosting capacitor, while the other boosting capacitors there are kept charged at the voltage $V_{RA}$. If there is a new request of reading of the memory within a very short interval of time, that is before the first boosting capacitor has been charged again with the correct value of voltage $V_{RA}$, the boosting effect will be achieved using a second boosting capacitor, and so on.

While preferred embodiments of the invention have been illustrated and described, it is to be understood that changes may be made therein that will not depart from the spirit and scope of the invention. Thus, the invention is to be limited only by the claims that follow.

We claim:

1. Circuit for the regulation of the row voltage in a memory, comprising a voltage regulator suitable to generate an output regulated voltage to be supplied to one or more rows of the memory when said one or more rows are being selected, the voltage regulator comprising charge boosting means coupled to an output of said voltage regulator and configured to be activated upon the selection of said one or more memory rows in order to boost said regulated voltage upon the selection of said one or more memory rows, said charge boosting means comprise at least one condenser having a first plate coupled to the output of said voltage regulator and a second plate coupled to a voltage signal that is variable between a first potential and a second potential greater than said first potential, said voltage signal passing from said first potential to said second potential upon the selection of said one or more memory rows.

2. The circuit of claim 1, wherein the charge boosting means is configured such that $C_B \times V_B = C_W \times V_R$, where $C_B$ is the capacitance of the at least one condenser, $V_B$ is the charging voltage of the at least one condenser, $C_W$ is the row capacitance, and $V_R$ is the row voltage.

3. The circuit of claim 2, wherein said first plate of said at least one capacitor is electrically connected with said output of the voltage regulator.

4. The circuit of claim 2, comprising a precharging circuit of said at least one capacitor that is selectively coupleable to the first plate of said at least one capacitor, and in that said first plate of said at least one capacitor is also selectively coupleable to said output of the voltage regulator.

5. The circuit of claim 4, wherein said precharging circuit comprises at least a second voltage regulator having an output that is selectively coupleable to the first plate of said at least one capacitor.

6. The circuit of claim 5, wherein said first plate of said at least one capacitor is coupled to the output of said second voltage regulator through a first switch means and is coupleable to said output of the voltage regulator through second switch means that are activatable as an alternative to said first switch means.

7. A memory comprising a plurality of selectively selectionable word lines, selection means for one or more of said word lines to bring the potential of said one or more selected word lines to a pre-established value, the selection means comprising one or more regulation circuits according to claim 1.

8. A circuit for providing row reading voltage in a non-volatile memory, comprising:
    a voltage regulator circuit having an input coupled to a voltage supply and an output coupled to one or more rows of the memory; and
    a boosting circuit having an input coupled to a control signal source and an output coupled to the output of the voltage regulator circuit, the boosting circuit configured to be activated in response to a control signal to supply voltage to the one or more rows of the memory, the output of the boosting circuit further connected to a variable voltage potential, the boosting circuit comprising a capacitive element coupled between the boosting circuit and the voltage regulator circuit, the capacitive element having a first terminal coupled to the boosting circuit output and a second terminal coupled to the voltage regulator output.

9. The circuit of claim 8, wherein the boosting circuit is configured such that $C_B \times V_B = C_W \times V_R$, where $C_B$ is the capacitance of the at least one capacitive element, $V_B$ is the charging voltage of the at least one capacitive element, $C_W$ is the capacitance associated with a selected row, and $V_R$ is the voltage of the selected row.

10. The circuit of claim 9, wherein the variable voltage potential is configured to change from a first potential to a second potential that is higher than the first potential in response to the selection signal for the one or more word lines of the memory.

11. The circuit of claim 9, wherein the voltage regulator circuit is coupled to the one or more word lines of the memory by a driver circuit.

12. The circuit of claim 11, further comprising a rows decoder having an input coupled to a word line address signal source and an output; and an elevator circuit coupled to the output of the row decoder and an output coupled to an input of the driver circuit, the driver circuit configured to couple the output of the voltage regulator circuit and the boosting circuit to the one or more word lines of the memory in response to receipt of a word line address signal through the row decoder and the step-up circuit.

13. The circuit of claim 12, further comprising a second row decoder coupled between the word line address signal source and the boosting circuit input.

14. The circuit of claim 11, further comprising a second voltage supply selectively coupled to a second terminal of the capacitive element via a first switch element and a second switch element coupled in series between the second terminal of the capacitive element and the voltage regulator output, the first switch element configured to open and the second switch element configured to close when there is a request to read the one or more word lines of the memory.

15. A circuit for providing row reading voltage in a non-volatile memory, comprising:
- a voltage regulator circuit having an input coupled to a voltage supply and an output coupled to one or more rows of the memory;
- a capacitive element having a first terminal coupled to the output of the voltage regulator circuit and a second terminal coupled to a voltage potential;
- an inverter having an input coupled to a control signal source and an output coupled to the second terminal of the capacitive element; and
- the voltage potential is configured to vary from a first voltage level to a second voltage level that is higher than the first voltage level in response to selection of the one or more rows of the memory.

16. The circuit of claim 15, wherein the capacitive element is configured such that $C_B \times V_B = C_W \times V_R$, where $C_B$ is the capacitance of the capacitive element, $V_B$ is the charging voltage of the capacitive element, $C_W$ is the row capacitance, and $V_R$ is the row voltage.

17. The circuit of claim 15, further comprising a first row decoder having an input coupled to a word line address signal source and an output; and a second row decoder having an input coupled to the word line address signal source and an output coupled to the input of the boosting circuit and configured to supply the control signal.

18. The circuit of claim 15, further comprising a second voltage supply selectively coupled to the second terminal of the capacitive element via a first switch element and a second switch element coupled in series between the second terminal of the capacitive element and the voltage regulator output, the first switch element configured to open and the second switch element configured to close when there is a request to read the one or more word lines of the memory.

19. The circuit of claim 18, wherein the first switch element is configured to close and the second switch element is configured to open in the absence of a request to read the one or more word lines of memory.

* * * * *